United States Patent
Bae

(10) Patent No.: US 9,385,120 B2
(45) Date of Patent: Jul. 5, 2016

(54) SEMICONDUCTOR DEVICE AND METHOD OF FABRICATING THE SAME

(71) Applicant: SAMSUNG ELECTRONICS CO., LTD., Gyeonggi-do (KR)

(72) Inventor: Hyun-Jun Bae, Gyeonggi-do (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/297,070

(22) Filed: Jun. 5, 2014

(65) Prior Publication Data

US 2015/0357326 A1 Dec. 10, 2015

(51) Int. Cl.
- *H01L 29/66* (2006.01)
- *H01L 21/8234* (2006.01)
- *H01L 27/088* (2006.01)
- *H01L 29/06* (2006.01)
- *H01L 21/02* (2006.01)

(52) U.S. Cl.
CPC .......... *H01L 27/088* (2013.01); *H01L 21/0223* (2013.01); *H01L 21/823437* (2013.01); *H01L 29/0611* (2013.01); *H01L 29/66545* (2013.01); *H01L 29/66606* (2013.01); *H01L 29/66871* (2013.01); *H01L 21/02252* (2013.01); *H01L 21/823456* (2013.01); *H01L 21/823481* (2013.01)

(58) Field of Classification Search
CPC ................ H01L 29/66545; H01L 29/66871; H01L 29/66606; H01L 21/82345
See application file for complete search history.

(56) References Cited

U.S. PATENT DOCUMENTS

| | | | |
|---|---|---|---|
| 6,566,734 B2 | 5/2003 | Sugihara et al. | |
| 6,974,736 B2 | 12/2005 | Ku et al. | |
| 7,166,506 B2 | 1/2007 | Prince et al. | |
| 7,381,608 B2 | 6/2008 | Brask et al. | |
| 2012/0018739 A1 | 1/2012 | Liang et al. | |
| 2012/0146142 A1 | 6/2012 | Zhu et al. | |
| 2015/0079780 A1* | 3/2015 | Liu ................... | H01L 29/66545 438/595 |
| 2015/0123175 A1* | 5/2015 | Lin ....................... | H01L 29/402 257/288 |

FOREIGN PATENT DOCUMENTS

| | | |
|---|---|---|
| JP | 2009152342 | 7/2009 |
| JP | 2010098157 | 4/2010 |
| KR | 1020010065192 | 7/2001 |
| KR | 1020050053249 | 6/2005 |

* cited by examiner

*Primary Examiner* — Phat X Cao
(74) *Attorney, Agent, or Firm* — F. Chau & Associates, LLC

(57) ABSTRACT

A method of fabricating a semiconductor device is provided. A sacrificial gate, a hard mask, a spacer and a first interlayer insulating film are formed on a substrate. The hard mask, a part of the spacer, and a part of the first interlayer insulating film are removed to expose an upper portion of the sacrificial gate. A sacrificial insulating layer covers the exposed upper portion of the sacrificial gate. A second interlayer insulating film covers the sacrificial insulating layer, the spacer and the first interlayer insulating film. The sacrificial insulating layer and the second interlayer insulating film are partially removed to expose a top surface of the sacrificial gate. The sacrificial gate and the sacrificial insulating layer are removed to form a trench. A gate structure is formed in the trench.

17 Claims, 11 Drawing Sheets

SEMICONDUCTOR DEVICE AND METHOD OF FABRICATING THE SAME

TECHNICAL FIELD

The present inventive concept relates to a semiconductor device and a method of fabricating the same.

DISCUSSION OF RELATED ART

As the feature size of metal oxide semiconductor (MOS) transistors is reduced, a combined structure of a gate having poly-silicon and a gate oxide having silicon oxide degrades performances of MOS transistors. For example, as MOS transistors is scaling down, the resistance of the gate increases and the leakage current of the gate oxide increases. New combined structures of a gate having metal and a gate oxide having a high-k dielectric material have been proposed to reduce resistance and leakage current of MOS transistors.

SUMMARY

According to an exemplary embodiment of the present inventive concept, a method of fabricating a semiconductor device is provided. A sacrificial gate, a hard mask, a spacer and a first interlayer insulating film are formed on a substrate. The hard mask is disposed on a top surface of the sacrificial gate. The spacer is disposed on a side surface of the sacrificial gate and a side surface of the hard mask. The first interlayer insulating film is disposed on the spacer. The hard mask, a part of the spacer, and a part of the first interlayer insulating film are removed to expose an upper portion of the sacrificial gate. A sacrificial insulating layer is formed on the exposed upper portion of the sacrificial gate. A second interlayer insulating film is formed on the sacrificial insulating layer, a remaining part of the spacer and a remaining part of the first interlayer insulating film. A part of the sacrificial insulating layer and a part of the second interlayer insulating film are removed to expose a top surface of the sacrificial gate. The sacrificial gate and the remaining sacrificial insulating layer are removed to form a trench. A lower portion of the trench is defined by the remaining part of the spacer and an upper portion of the trench is defined by a remaining part of the second interlayer insulating film.

According to an exemplary embodiment of the present inventive concept, a method of fabricating a semiconductor device is provided. A field isolation area and an active area are formed in a semiconductor. Surface heights of the field isolation area and the active area are different from each other. First and second sacrificial gates are formed on the field isolation area and the active area, respectively. First and second spacers are formed on lower portions of the first and second sacrificial gates, respectively. A sacrificial insulating layer is formed on upper portions of the first and second sacrificial gates. The sacrificial insulating layer is partially removed to expose top surfaces of the first and second sacrificial gates.

According to an exemplary embodiment of the present inventive concept, a semiconductor device is provided. A first gate structure is disposed on an active region of a substrate. A spacer is disposed on a lower side surface of the gate structure. An interlayer insulating film is disposed on an upper side surface of the gate structure and a top surface of the spacer. A dielectric constant of the spacer is greater than a dielectric constant of the interlayer insulating film.

BRIEF DESCRIPTION OF THE DRAWINGS

These and other features of the present inventive concept will become more apparent by describing in detail exemplary embodiments thereof with reference to the accompanying drawings of which.

DETAILED DESCRIPTION OF EXEMPLARY EMBODIMENTS

Figure 1:
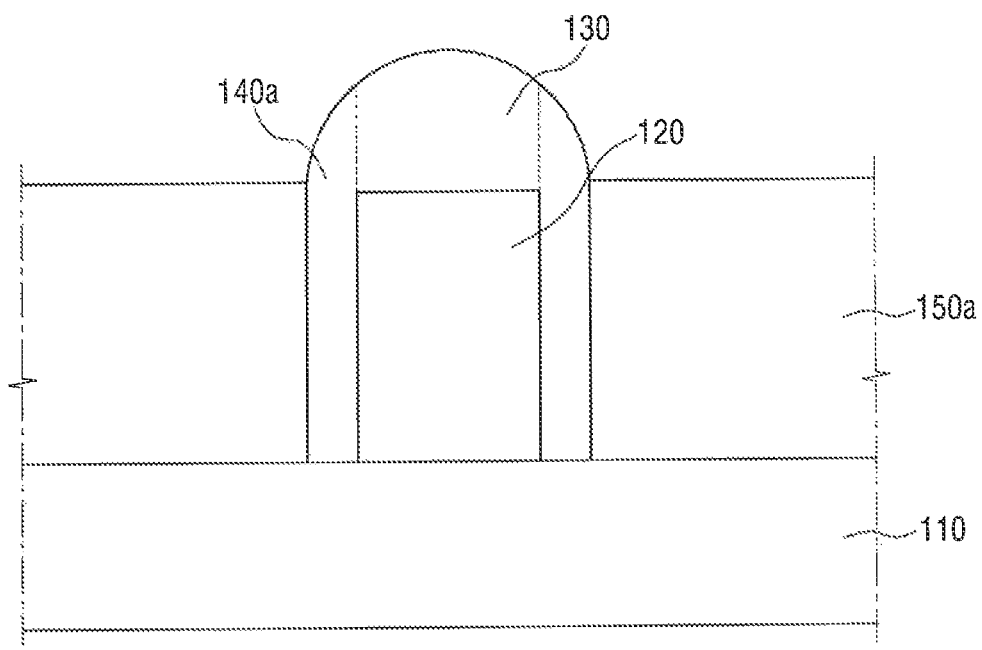
FIGS. 1 through 7 are cross-sectional views illustrating a method of fabricating a semiconductor device according to an exemplary embodiment of the present inventive concept.

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

FIGS. 1 through 7 are cross-sectional views illustrating a method of fabricating a semiconductor device according to an exemplary embodiment of the present inventive concept.

Referring to FIG. 1, a sacrificial gate 120, spacers 140a which are formed on side surfaces of the sacrificial gate 120, a hard mask 130 which is formed on a top surface of the sacrificial gate 120, and a first interlayer insulating film 150a which is formed around the spacers 140a are provided on a substrate 110.

For example, the substrate 110 may be formed of at least one of Si, Ge, Size, GaP, GaAs, SiC, SiGeC, InAs and InP. In addition, the substrate 110 may be a silicon-on-insulator (SOI) substrate.

The sacrificial gate 120 may be formed of, for example, amorphous silicon. Although not shown in the drawing, an insulating layer may be disposed between the sacrificial gate 120 and the substrate 110.

The hard mask 130 is used to pattern the sacrificial gate 120. The hard mask 130 may include at least one of a nitride layer and an oxynitride layer, for example. The spacers 140a is formed on the side surfaces of the sacrificial gate 120 and side surfaces of the hard mask 130. The spacers 140a may include at least one of a nitride layer and an oxynitride layer. In FIG. 1, the hard mask 130 and the spacers 140a have a continuous profile, but the present inventive concept is not limited thereto.

The first interlayer insulating film 150a may include, for example, an oxide layer.

To form the cross-sectional structure of FIG. 1, the following processes may be performed. The sacrificial gate 120 is formed on the substrate 110 using the hard mask 130. A preliminary spacer layer is formed on the sacrificial gate 120 and the hard mask 130. The spacer 140a is formed by partially removing the preliminary spacer layer. A preliminary first interlayer insulating film is formed on the substrate 110, covering the spacer 140a and the hard mask 130. A planarization process is applied to the preliminary first interlayer insulating film to form the first interlayer insulating film. The corners of the hard mask 130 and the spacer 140a may be formed when the spacer 140a. is formed.

Figure 2:
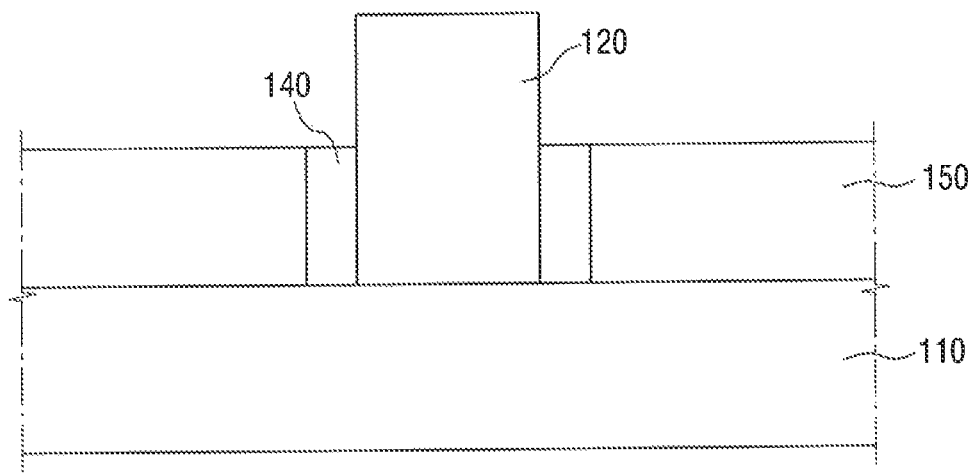

Referring to FIG. 2, the hard mask 130, parts of the spacers 140a, and a part of the first interlayer insulating film 150a are removed such that an upper portion of the sacrificial gate 120 is exposed. The hard mask 130, the spacers 140a, and the first interlayer insulating film 150a may be etched using, for example, an etch-back process to expose the sacrificial gate 120. For example, a single etch-back process may apply to remove the hard mask 130, the parts of the spacers 140a, and the part of the first interlayer insulating film 150a. The hard mask 130, the parts of the spacers 140a, and the part of the first interlayer insulating film 150a may be simultaneously etched under the single etch-back process. As a result, a height of the spacers 140 and a height of the first interlayer insulating film 150 may be reduced to exposed the upper portion of the sacrificial gate 120.

Figure 3:
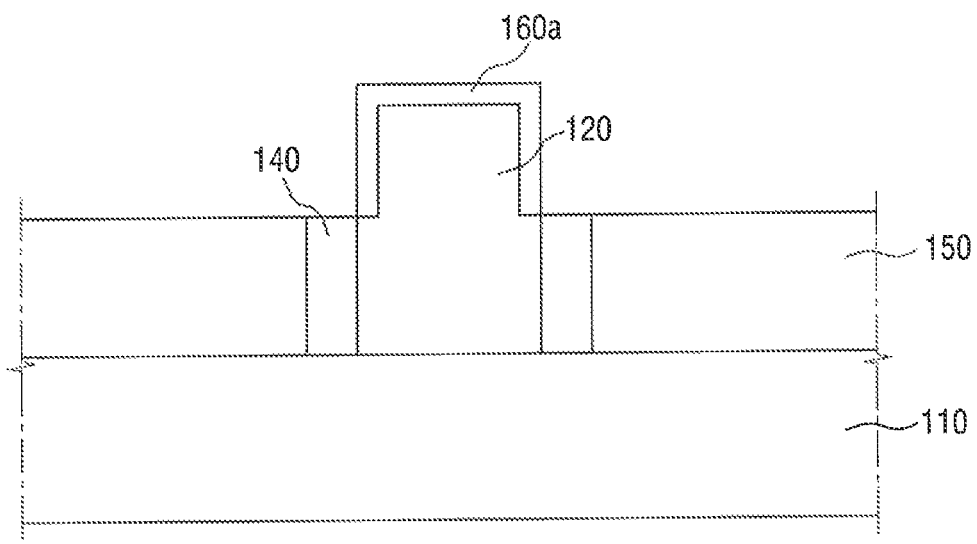

Referring to FIG. 3, a sacrificial insulating layer 160a is formed on the exposed upper portion of the sacrificial gate 120. For example, the sacrificial insulating layer 160a covers the exposed upper portion of the sacrificial gate 120.

Here, the sacrificial insulating layer 160a may be formed using a plasma oxidation process. The plasma oxidation process may be performed at a relatively low temperature of 400° C. or below, for example. The sacrificial insulating layer 160a may include an oxide layer. The inventive concept is not limited thereto, and other oxidation methods such as a thermal oxidation process may be used.

A lower portion of the sacrificial gate 120 is covered by the spacers 140. Thus, the sacrificial insulating layer 160a is not formed on the lower portion of the sacrificial gate 120 when the plasma oxidation process is applied to form the sacrificial insulating layer 160a. As will be described later, the sacrificial insulating layer 160a prevents the formation of divots in the spacers 140 when the sacrificial gate 120 is removed (see FIG. 6).

Figure 4:
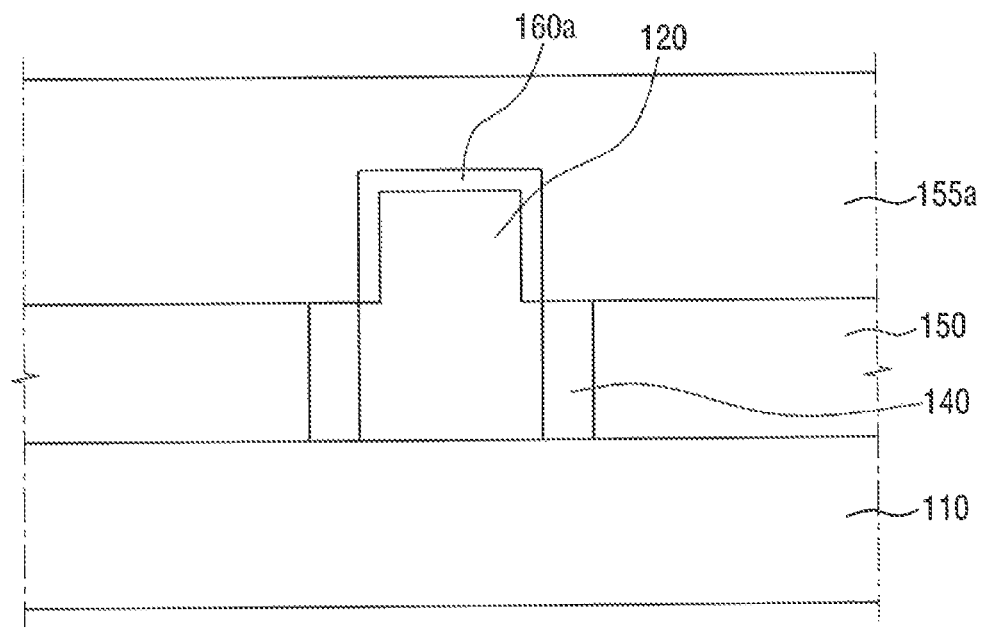

Referring to FIG. 4, a second interlayer insulating film 155a is formed on the sacrificial insulating layer 160a and the first interlayer insulating layer 150. For example, the second interlayer insulating film 155a completely covers the sacrificial insulating layer 160a. The second interlayer insulating film 155a may include an oxide layer. For example, the second interlayer insulating film 155a may be a high-density plasma (HDP) oxide layer having rigid characteristics.

Figure 5:
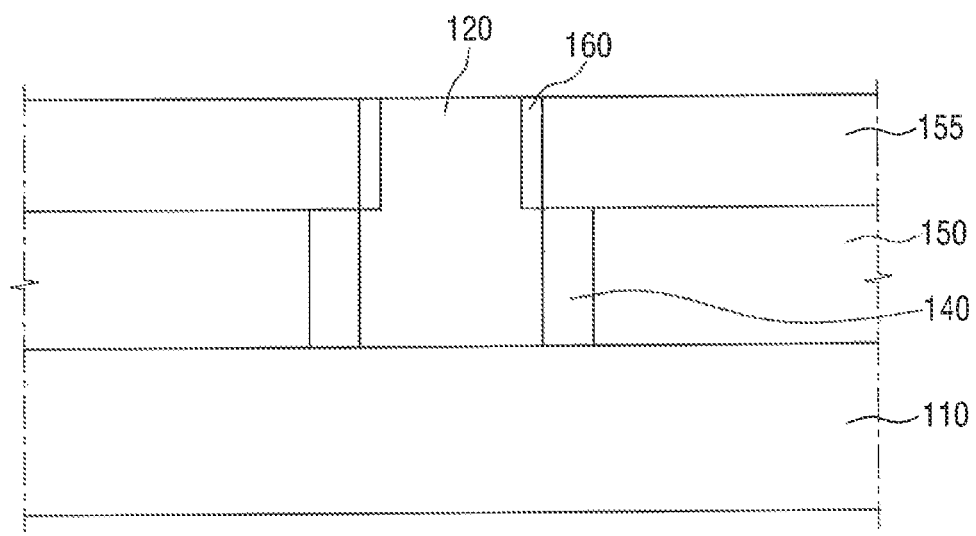

Referring to FIG. 5, a part of the sacrificial layer 160a and a part of the second interlayer insulating film 155a are removed such that a top surface of the upper portion of the sacrificial gate 120 is exposed. For example, a chemical mechanical polishing (CMP) process may be performed on the structure of FIG. 4 until the top surface of the sacrificial gate 120 is exposed. Therefore, the sacrificial insulating layer 160 is located only on upper side surfaces of the sacrificial gate 120.

Figure 6:
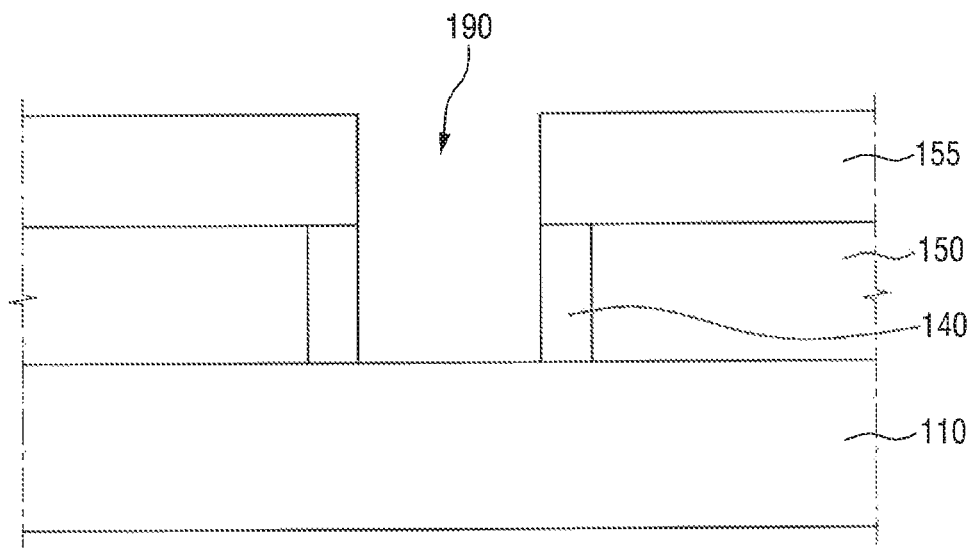

Referring to FIG. 6, a trench 190 is formed by removing the sacrificial gate 120 and the remaining sacrificial insulating layer 160. For example, when the sacrificial gate 120 is removed, the sacrificial insulating layer 160 located on the upper side surfaces of the sacrificial gate 120 is also removed.

Since the sacrificial insulating layer 160 covers the upper side surfaces of the sacrificial gate 120, and the second interlayer insulating film 155 covers top surfaces of the spacers 140, divots are hardly formed in the spacers 140 when the sacrificial gate 120 is removed.

Figure 7:
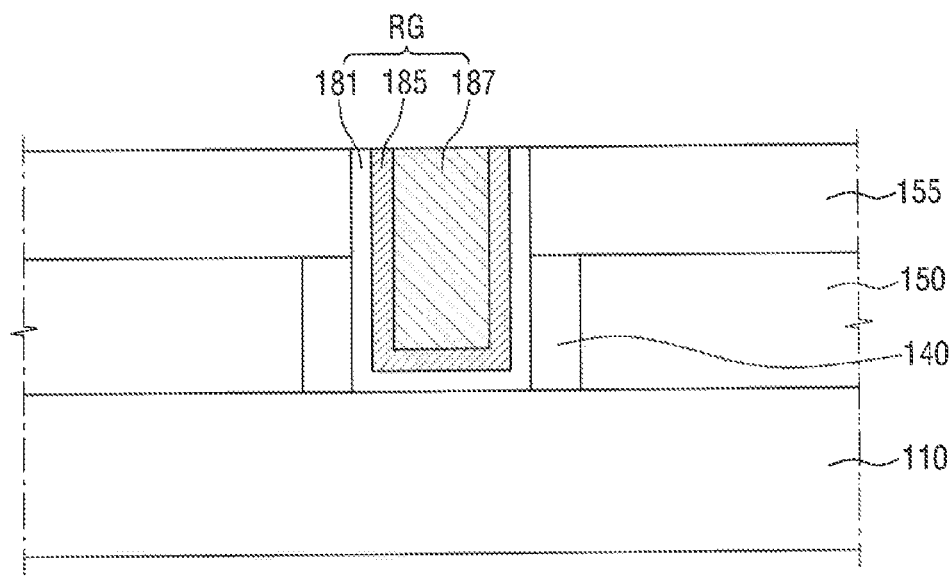

Referring to FIG. 7, a replacement gate RG is formed in the trench 190.

For example, the replacement gate RG includes a gate insulating layer 181, a work function metal layer 185 and a gate pattern 187. The gate insulating layer 181 is conformally formed on side and bottom surfaces of the trench 190. The work function metal layer 185 is conformally formed on the gate insulating layer 181. The gate pattern 187 is formed on the work function metal layer 185, filling the trench 190.

The gate insulating layer 181 may include a high-k dielectric material having a high dielectric constant than a silicon oxide layer. For example, the gate insulating layer 181 may include at least one of $HfO_2$, $ZrO_2$, $TaO_2$, $TiO_2$, $SrTiO_3$ and $(Ba,Sr)TiO_3$. The thickness of the gate insulating layer 181 may be determined according to a kind of the material of the gate insulating layer 181. For example, when the gate insulating layer 181 includes $HfO_2$, the thickness of the gate insulating layer 181 may be about 5 Å to about 50 Å.

The work function metal layer 185 may be an N-type work function metal layer or a P-type work function metal layer. For example, when the work function metal layer 185 is an N-work function metal layer, it may adjust a work function of an N-type transistor. The N-type work function metal layer 185 may include at least one of TiAl, TiAlN, TaC, TiC, and HfSi. The work function metal layer 185 may be formed to have a thickness of about 30 Å to about 120 Å, for example.

When the work function metal layer 185 is a P-type work function metal layer, it may adjust a work function of a P-type transistor. The P-type work function metal layer 185 may include a TiN layer, for example. The P-type work function metal layer 185 may be formed to have a thickness of about 50 Å to about 100 Å.

The gate pattern 187 fills the trench 190. The gate pattern 187 may include Al or W, for example.

Here, the replacement gate (181, 185, 187) is higher than the remaining spacers 140. In addition, the replacement gate RG is not formed on the top surfaces of the spacers 140. Further, the second interlayer insulating layer 155 covers the top surfaces of the spacers 140 and side surfaces of the replacement gate RG at its upper portion.

FIGS. 8 through 12 are cross-sectional views illustrating a method of fabricating a semiconductor device according to an exemplary embodiment of the present inventive concept. For the convenience of a description, differences from the previous embodiment are mainly described above with reference to FIGS. 1 through 7.

Figure 8:
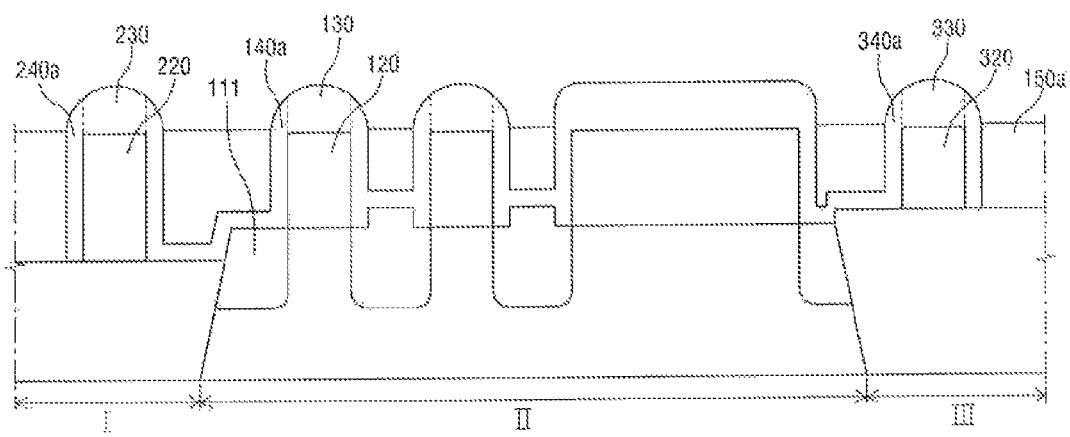
FIGS. 8 through 12 are cross-sectional views illustrating a method of fabricating a semiconductor device according to an exemplary embodiment of the present inventive concept.

Referring to FIG. 8, first through third areas I through III are defined in a substrate 110. The first area I and the third area III are field isolation areas, and the second area II is an active area defined by the field isolation areas I and III. As shown in FIG. 8, the field isolation areas I and III have different surface heights from each other. The active area II has a surface height different from the surface heights of the field isolation areas I and III. For example, the surface height of the second area II (the active area) is greater than the surface height of the first area I (the field isolation area), and the surface height of the third area III (the field isolation area) is greater than the surface height of the second area II (the active area).

On the first area I, a first sacrificial gate 220 is formed, a first hard mask 230 is formed on a top surface of the first sacrificial gate 220, and first spacers 240a are formed on sidewalls of the first sacrificial gate 220.

On the second area II, a second sacrificial gate 120 is formed, a second hard mask 130 is formed on a top surface of the second sacrificial gate 120, and second spacers 140*a* are formed on sidewalls of the second sacrificial gate 120.

Source/drain regions 111 are formed on both sides of the second sacrificial gate 120. The source/drain regions 111 may be elevated source/drain regions. When a semiconductor device is a P-type transistor, the source/drain regions 111 may include a compressive stress material. The compressive stress material may be a material (e.g., SiGe) having a greater lattice constant than Si. The compressive stress material may increase the mobility of carriers in a channel region by applying compressive stress to the second area II disposed between the source/drain regions 111. When the semiconductor device is an N-type transistor, the source/drain regions 111 may include substantially the same material as the substrate 110 or a tensile stress material. For example, when the substrate 110 is Si, the source/drain regions 111 may be Si or a material (e.g., SiC) having a smaller lattice constant than Si.

On the third area III, a third sacrificial gate 320 is formed, a third hard mask 330 is formed on a top surface of the third sacrificial gate 320, and third spacers 340*a* are formed on sidewalls of the third sacrificial gate 320.

A first interlayer insulating film 150*a* is formed to cover side surfaces of the first, second and third spacers 240*a*, 140*a* and 340*a* and expose top surfaces of the first, second and third hard masks 230, 130 and 330.

Figure 9:
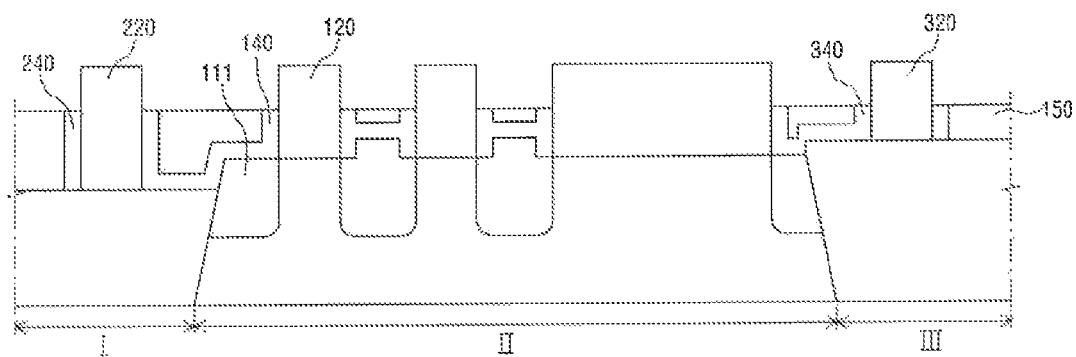

Referring to FIG. 9, the first, second and third hard masks 230, 130 and 330 are removed, and, at the same time, the first, second and third spacers 240*a*, 140*a* and 340*a* are partially removed. As a result, the first spacers 240 are formed on lower portions of side surfaces of the first sacrificial gate 220, the second spacers 140 are formed on lower portions of side surfaces of the second sacrificial gate 120, and the third spacers 340 are formed on lower portions of side surfaces of the third sacrificial gate 320.

Figure 10:
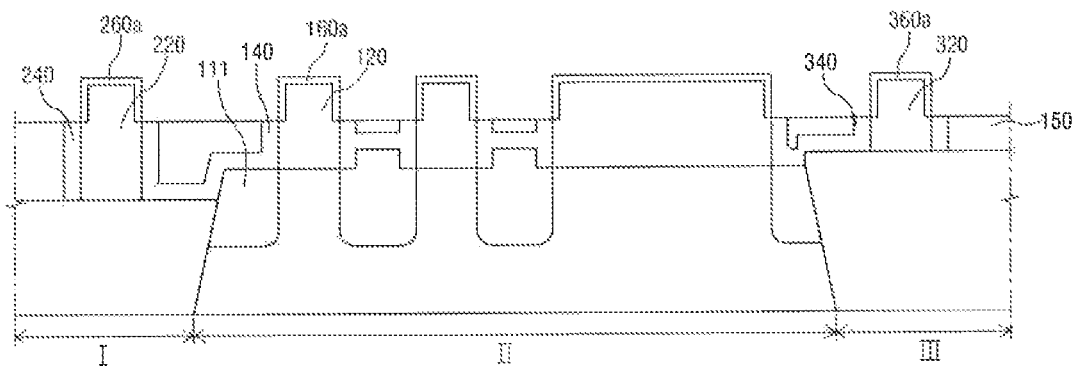

Referring to FIG. 10, a first sacrificial insulating layer 260*a* is formed on an upper portion of the first sacrificial gate 220. In addition, a second sacrificial insulating layer 160*a* is formed on an upper portion of the second sacrificial gate 120. A third sacrificial insulating layer 360*a* is formed on an upper portion of the third sacrificial gate 320. The first, second, and third sacrificial insulating layers 260*a*, 160*a* and 360*a* cover the upper portions of the first, second and third sacrificial gate 220, 120 and 320, respectively.

The first, second and third sacrificial insulating layers 260*a*, 160*a* and 360*a* may be oxide layers. The first, second and third sacrificial insulating layers 260*a*, 160*a* and 360*a* may be formed using, for example, a plasma oxidation process.

Figure 11:
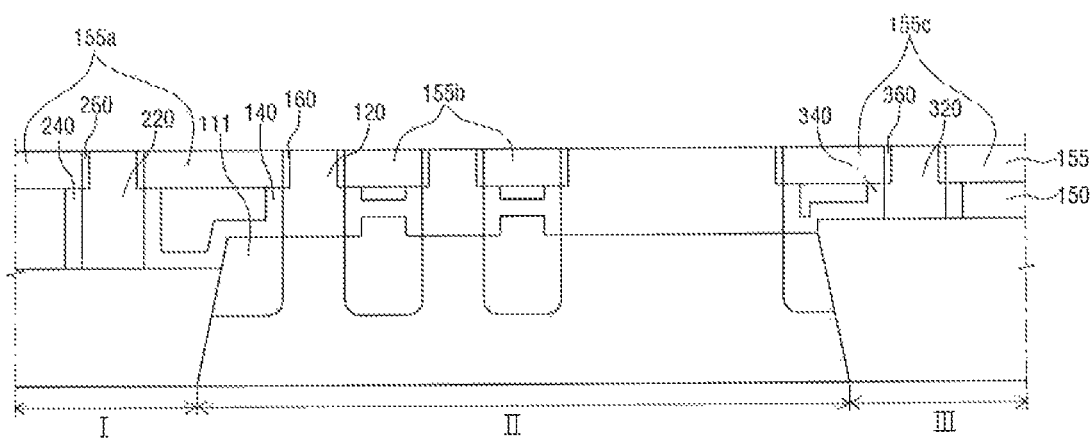

Referring to FIG. 11, a preliminary second interlayer insulating film is formed on the first, second and third sacrificial insulating layers 260*a*, 160*a* and 360*a*. Then, the first, second and third sacrificial insulating layers 260*a*, 160*a* and 360*a* and the preliminary second interlayer insulating film are planarized to expose the top surfaces of the first, second and third sacrificial gates 220, 120 and 320 and to form second interlayer insulating films 155*a*, 155*h* and 155*c*.

Figure 12:
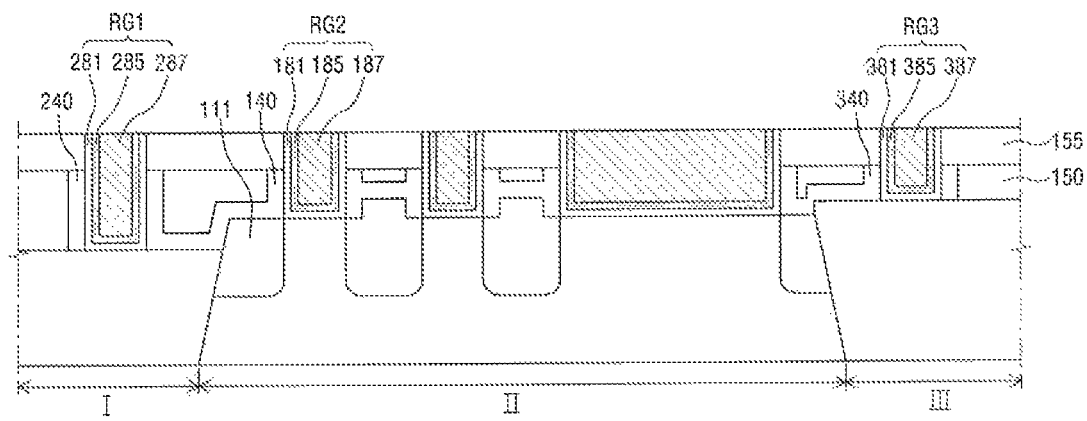

Referring to FIG. 12, the exposed first, second and third sacrificial gates 220, 120 and 320 and the planarized first, second and third sacrificial insulating layers 260, 160 and 360 are removed to form first, second and third trenches. Then, first, second and third replacement gates RG1, RG2 and RG3 are formed in the first, second and third trenches, respectively.

The first replacement gate RG1 includes a gate insulating layer 281, a work function metal layer 285 and a gate pattern 287. The second replacement gate RG2 includes a gate insulating layer 181, a work function metal layer 185 and a gate pattern 187. The third replacement gate RG3 includes a gate insulating layer 381, a work function metal layer 385 and a gate pattern 387.

The first replacement gate RG1 is higher than the first spacers 240, the second replacement gate RG2 is higher than the second spacers 140, and the third replacement gate RG3 is higher than the third spacers 340.

The first replacement gate RG1 is not formed on top surfaces of the first spacers 240, the second replacement gate RG2 is not formed on top surfaces of the second spacers 140, and the third replacement gate RG3 is not formed on top surfaces of the third spacers 340.

The second interlayer insulating film 155*a* is in contact with the top surfaces of the first spacers 240 and side surfaces of the upper portion in the first replacement gate RG1. The second interlayer insulating film 155*b* is in contact with the top surfaces of the second spacers 140 and side surfaces of the upper portion in the second replacement gate RG2. The third interlayer insulating film 155*c* is in contact with the top surfaces of the third spacers 340 and side surfaces of the upper portion in the third replacement gate RG3.

The top surfaces of the first, second and third spacers 240, 140 and 340 are at the same height. This is because the first, second and third spacers 240, 140 and 340 are simultaneously etched as described above with reference to FIG. 9.

Figure 13:
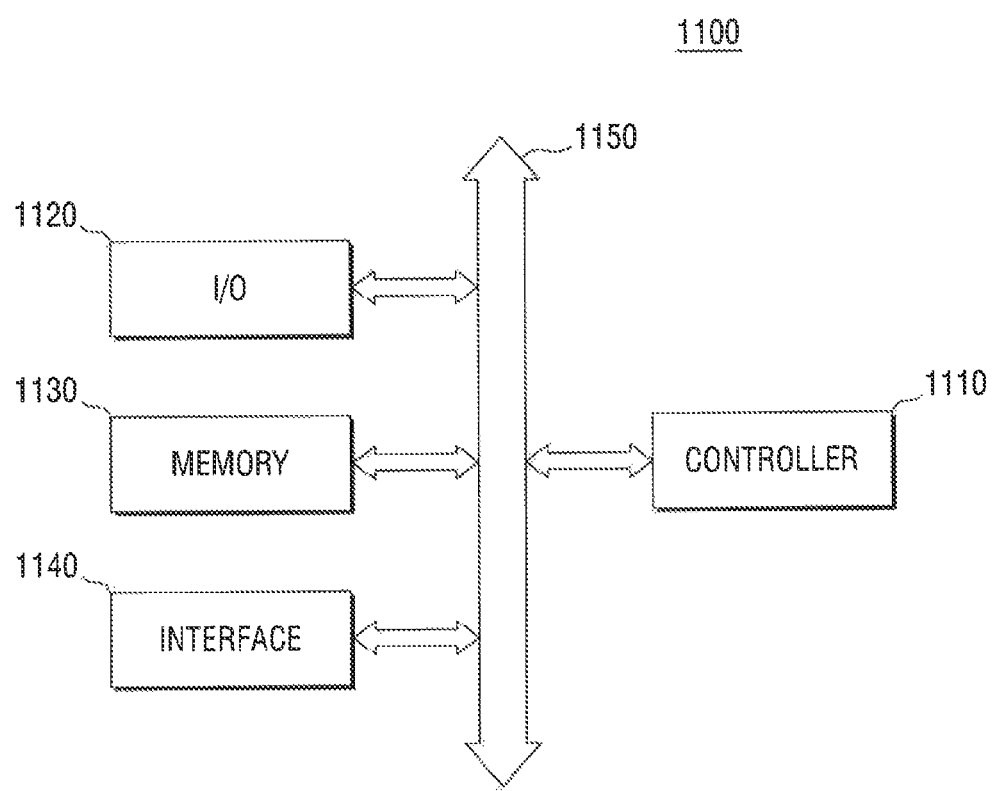
FIG. 13 is a block diagram of an electronic system including a semiconductor device according to an exemplary embodiment of the present inventive concept.

FIG. 13 is a block diagram of an electronic system including a semiconductor device according to an exemplary embodiment of the present inventive concept.

Referring to FIG. 13, the electronic system 1100 includes a controller 1110, an input/output (I/O) device 1120, a memory device 1130, an interface 1140 and a bus 1150. The controller 1110, the I/O device 1120, the memory device 1130 and/or the interface 1140 are connected to one another by the bus 1150. The bus 1150 may serve as a path for transmitting data.

The controller 1110 may include at least one of a microprocessor, a digital signal processor, a microcontroller and logic devices capable of performing similar functions to those of a microprocessor, a digital signal processor and a microcontroller. The I/O device 1120 may include a keypad, a keyboard and a display device. The memory device 1130 may store data and/or commands. The interface 1140 may be used to transmit data to or receive data from a communication network. The interface 1140 may be a wired or wireless interface. For example, the interface 1140 may include an antenna or a wired or wireless transceiver. Although not shown in the drawing, the electronic system 1100 may be an operating memory for the controller 1110, and may also include a high-speed dynamic random access memory (DRAM) or static random access memory (SRAM). Fin field effect transistors according to an exemplary embodiment of the present inventive concept may be provided in the memory device 1130 or in the controller 1110 or the I/O device 1120.

The electronic system 1100 may be applied to electronic products including a personal data assistant (PDA), a portable computer, a web tablet, a wireless phone, a mobile phone, a digital music player, or a memory card, for example.

Figure 14A:
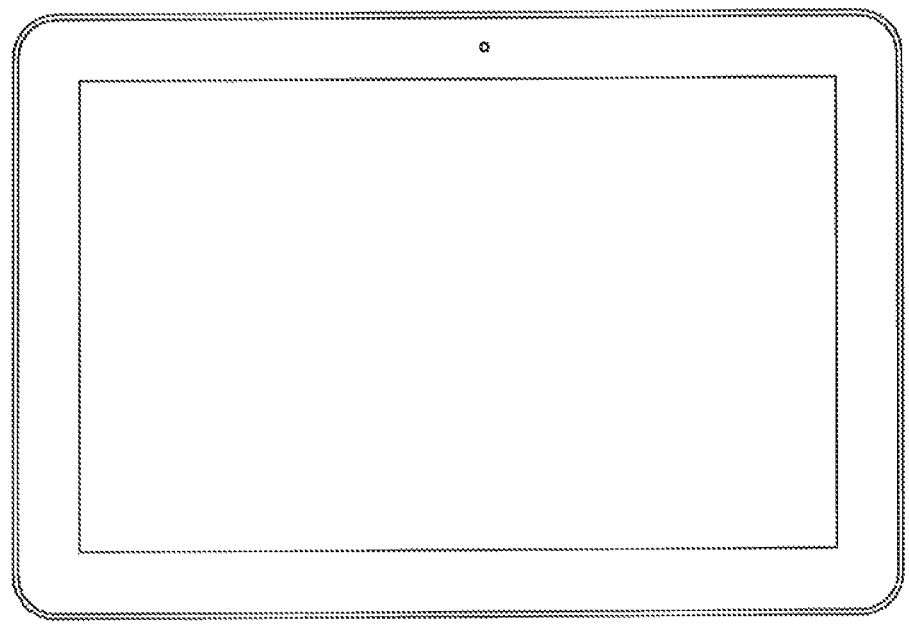
FIGS. 14A and 14B are application systems employing a semiconductor device according to an exemplary embodiment of the present inventive concept.
Figure 14B:
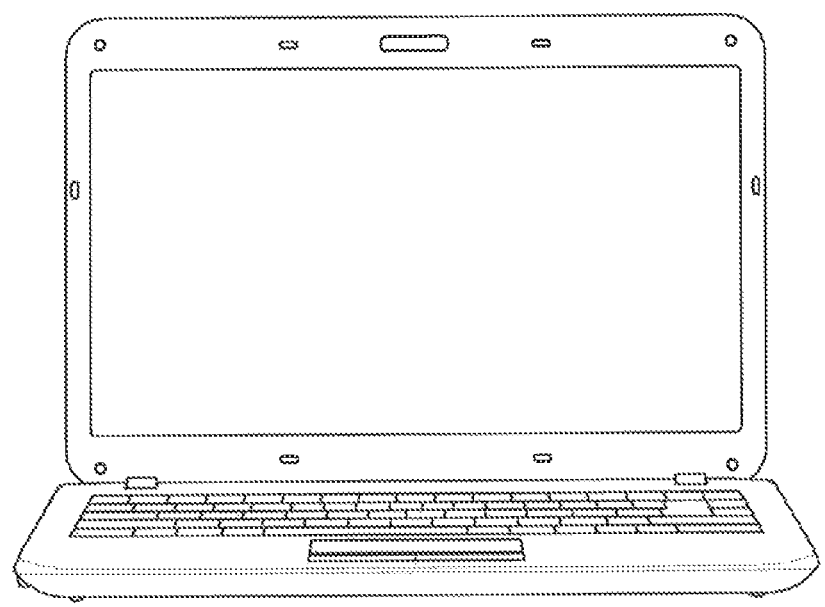

FIGS. 14A and 14B are diagrams illustrating application systems employing a semiconductor system having a semiconductor device according to an exemplary embodiment of the present inventive concept. FIG. 14A illustrates a tablet personal computer (PC), and FIG. 14B illustrates a notebook computer. At least one semiconductor device according to exemplary embodiment of the present inventive concept may be used in a tablet PC, a notebook computer or various integrated circuit (IC) devices.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A method of fabricating a semiconductor device, the method comprising:
    forming a sacrificial gate, a hard mask, a spacer and a first interlayer insulating film on a substrate, wherein the hard mask is disposed on a top surface of the sacrificial gate, wherein the spacer is disposed on a side surface of the sacrificial gate and a side surface of the hard mask, and wherein the first interlayer insulating film is disposed on the spacer;
    removing the hard mask, a part of the spacer, and a part of the first interlayer insulating film to expose an upper portion of the sacrificial gate;
    forming a sacrificial insulating layer on the exposed upper portion of the sacrificial gate;
    forming a second interlayer insulating film on the sacrificial insulating layer, a remaining part of the spacer and a remaining part of the first interlayer insulating film;
    removing a part of the sacrificial insulating layer and a part of the second interlayer insulating film to expose a top surface of the sacrificial gate; and
    removing the sacrificial gate and the remaining sacrificial insulating layer to form a trench wherein a lower portion of the trench is defined by the remaining part of the spacer and an upper portion of the trench is defined by a remaining part of the second interlayer insulating film.

2. The method of claim 1, wherein the forming of the sacrificial insulating layer includes oxidizing, using a plasma oxidation, part of the upper portion of the sacrificial gate to form the sacrificial insulating layer.

3. The method of claim 1, wherein the sacrificial insulating layer is an oxide layer.

4. The method of claim 1, further comprising forming a replacement gate in the trench, wherein a top surface of the replacement gate is higher than a top surface of the remaining part of the spacer.

5. The method of claim 4, wherein the replacement gate is not formed on the top surface of the remaining part of the spacer.

6. The method of claim 4, wherein an upper portion of the replacement gate is in contact with the second interlayer insulating film, and a lower portion of the replacement gate is in contact with the spacer.

7. The method of claim 4, wherein the replacement gate comprises a work function metal layer and a gate pattern, wherein the work function metal layer is conformally formed on side and bottom surfaces of the trench, and wherein the gate pattern is formed on the work function metal layer to fill the trench.

8. The method of claim 1, wherein the forming of the sacrificial gate, the hard mask, the spacer and the first interlayer insulating film on the substrate comprises:
    forming the sacrificial gate on the substrate using the hard mask;
    forming a preliminary spacer layer on the sacrificial gate and the hard mask;
    partially removing the preliminary spacer layer to form the spacer; and
    forming the first interlayer insulating film on the spacer.

9. A method of fabricating a semiconductor device, the method comprising:
    forming a field isolation area and an active area having different surface heights from each other;
    forming first and second sacrificial gates on the field isolation area and the active area, respectively;
    forming first and second spacers on lower sidewall portions of the first and second sacrificial gates, respectively, wherein the first and second spacers expose upper sidewall portions of the first and second sacrificial gates, respectively;
    forming sacrificial insulating layers on the upper sidewall portions of the first and second sacrificial gates; and
    partially removing upper portions of the sacrificial insulating layer to expose top surfaces of the first and second sacrificial gates.

10. The method of claim 9, wherein the forming of the sacrificial insulating layer includes oxidizing, using a plasma oxidation, parts of the upper sidewall portions of the first and second sacrificial gates to form the sacrificial insulating layer.

11. The method of claim 9, wherein the sacrificial insulating layer includes an oxide layer.

12. The method of claim 9, further comprising:
    removing the exposed first and second sacrificial gates and a remaining part of the sacrificial insulating layer to form first and second trenches; and
    forming first and second replacement gates in the first and second trenches, respectively.

13. The method of claim 12, wherein a height of the first replacement gate is greater than a height of the first spacer, and a height of the second replacement gate is greater than a height of the second spacer.

14. The method of claim 13, wherein the first replacement gate is not formed on a top surface of the first spacer, and the second replacement gate is not formed on a top surface of the second spacer.

15. The method of claim 13, further comprising forming an interlayer insulating film, wherein the interlayer insulation film is in contact with the top surface of the first spacer and an upper side surface of the first replacement gate, wherein the interlayer insulation film is further in contact with the top surface of the second spacer and an upper side surface of the second replacement gate.

16. The method of claim 9, wherein the top surface of the first spacer is substantially level with the top surface of the second spacer.

17. The method of claim 9, wherein the surface height of the active area is greater than the surface height of the field isolation area.

* * * * *